US 9,313,057 B2

(12) United States Patent
Chuang et al.

(10) Patent No.: US 9,313,057 B2
(45) Date of Patent: Apr. 12, 2016

(54) TARGET SIGNAL DETERMINATION METHOD AND ASSOCIATED APPARATUS

(75) Inventors: Ching-Hsiang Chuang, Hsinchu Hsien (TW); Shao-Ping Hung, Hsinchu Hsien (TW); Tien-Hsin Ho, Hsinchu Hsien (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 572 days.

(21) Appl. No.: 12/912,200

(22) Filed: Oct. 26, 2010

(65) Prior Publication Data

US 2011/0119008 A1  May 19, 2011

(30) Foreign Application Priority Data

Nov. 16, 2009 (TW) .............................. 098138847 A

(51) Int. Cl.
*G01R 1/04* (2006.01)
*G01R 1/40* (2006.01)
*G06F 3/01* (2006.01)
*G06F 3/03* (2006.01)
*H04L 25/06* (2006.01)
*H03L 1/00* (2006.01)
*G10L 25/06* (2013.01)

(52) U.S. Cl.
CPC ............... *H04L 25/065* (2013.01); *G10L 25/06* (2013.01); *H03L 1/00* (2013.01)

(58) Field of Classification Search
CPC ........................................................ H03L 1/00
USPC ............... 702/20, 66, 73, 179, 183, 189, 193; 342/107, 132, 174; 704/219
See application file for complete search history.

(56) References Cited

U.S. PATENT DOCUMENTS

| 4,717,916 | A  | * | 1/1988  | Adams et al. .................. 342/107 |
| 5,036,324 | A  | * | 7/1991  | Lamper et al. ................. 342/132 |
| 5,163,176 | A  | * | 11/1992 | Flumerfelt et al. ............ 342/174 |
| 5,302,956 | A  | * | 4/1994  | Asbury et al. ................... 342/70 |
| 6,691,082 | B1 | * | 2/2004  | Aguilar et al. ................. 704/219 |
| 7,346,175 | B2 | * | 3/2008  | Hui et al. ......................... 381/74 |
| 2005/0195967 | A1 | * | 9/2005  | Pessoa et al. .................. 379/283 |
| 2007/0220073 | A1 | * | 9/2007  | Traber ........................... 708/200 |

* cited by examiner

*Primary Examiner* — Gregory J Toatley
*Assistant Examiner* — Felix Suarez
(74) *Attorney, Agent, or Firm* — WPAT, PC; Justin King

(57) ABSTRACT

A method and associated apparatus using delay correlation for determining whether an input signal is a target signal is provided. The method includes sampling the input signal to generate 2N sample values, the sample values having a period N, where N is a positive integer; calculating the 2N sample values to obtain a first value according to a first operation method; calculating the 2N sample values to obtain a second value according to a second operation method; obtaining a determination value according to the first value and the second value; and determining whether the input signal is the target signal according to the determination value and a threshold.

19 Claims, 8 Drawing Sheets

TARGET SIGNAL DETERMINATION METHOD AND ASSOCIATED APPARATUS

CROSS REFERENCE TO RELATED PATENT APPLICATION

This patent application is based on Taiwan, R.O.C. patent application No. 098138847 filed on Nov. 16, 2009.

FIELD OF THE INVENTION

The present invention relates to a signal receiving method and apparatus, and more particularly to signal receiving method and apparatus using delay correlation for determining a target signal.

BACKGROUND OF THE INVENTION

When receiving a signal, a communication system first performs packet detection to make sure whether the receiving signal is a target signal matching the system specification. When the result of the packet detection reveals that the receiving signal is the target signal matching the system specification, the system continues to receive the signal. Otherwise, when the result of the packet detection reveals that the receiving signal is not the target signal matching the system specification; the system terminates receiving the subsequent signal.

If the packet detection encounters an error, such that the signal supposed to be received is misjudged as a non-target signal, which causes the system to lose the signal, which causes the signal unstable or unclear. However, if the signal is not supposed be received and is misjudged as a target signal, but the system receives and processes unrelated signal; such that the system resources are wasted, which further expels those signals really needing received and processed. Therefore, the correctness of the packet detection matters for the correctness and the stability of the system.

When the receiving signal is conducted periodically, a detection mechanism called delay correlation is often used on the packet detection. FIG. 1 is a diagram of the receiving signal after sampled for both a conventional practice and the current invention. The arrow represents the order to feed in the signal processing circuit (not shown). r(t) represents the sample data at time t. The period of the sample data is N, i.e., $$r(t+N)=r(t)$$

The delay correlation of the signal from the prior art is obtained by the following equation:

$$\frac{\sum_{k=0}^{N-1} r(t+k) \cdot r^*(t+N+k)}{\sum_{k=0}^{N-1} r(t+k) \cdot r^*(t+k)}$$

When the result of the above equation is larger than a threshold, the input signal can be determined to be the target signal matching the system specification. If not, the receiving signal may be not the target signal, and the system should stop receiving the present signal.

From the above equation, one can find out that the denominator only relates to the N sample data, i.e. r(t) to r(t+N−1), and the influence of the other sample data at the numerator r(t+N) to r(t+2N−1) is ignored. That is, calculating the denominator need N sample data, which means the reference data are a half of calculating the numerator. Since the sample value needed for calculating the denominator is a half of calculating the numerator, the existing information is wasted. Furthermore, since the number of the sampling points of the numerator and the denominator on the above equation are different, the energy considered in the denominator is related to only a half of the sample data at the numerator, i.e. the denominator cannot reflect the energy of all sample data. Consequently, the peak interval of delay correlation is calculated more unstably such that the misjudging probability is increased. Therefore, it is urgently needed a target signal determination method and associated apparatus using delay correlation for determining a target signal more correctly.

SUMMARY OF THE INVENTION

It is one of the objectives of the present invention to provide a target signal determination method and associated apparatus using delay correlation for determining the target signal more correctly.

The invention provides a method using delay correlation for determining whether an input signal is a target signal, comprising: sampling the input signal to generate 2N sample values, the sample values having a period N, where N is a positive integer; calculating the 2N sample values to obtain a first value according to a first operation method; calculating the 2N sample values to obtain a second value according to a second operation method; obtaining a determination value according to the first value and the second value; and determining whether the input signal is the target signal according to the determination value and a threshold.

The invention further provides an apparatus using delay correlation for determining whether an input signal is a target signal, comprising: a sampling unit, for sampling the input signal to generate 2N sample values, the sample values having a period N, where N is a positive integer; a delaying unit, for delaying the N sample values within the 2N sample values to output N delayed sample values; a conjugate multiplier, for conjugately multiplying according to the N delayed sample values and the N undelayed sample values within the 2N sample values to generate a plurality of conjugate multiplying values; a calculation apparatus, coupled to the conjugate multiplier, for calculating the conjugate multiplying values to obtain a determination value; and a determination apparatus, coupled to the calculation apparatus, for determining whether the input signal is the target signal according to the determination value and a threshold.

The invention provides a target signal determination method and associated apparatus with a smoother and more stable peak interval for determining a target signal to reduce the misjudging probability.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

In order to truly reflect the energy of all sample data for delay correlation calculation, one can use the following equation to calculate the signal delay correlation:

$$\frac{\sum_{k=0}^{N-1} r(t+k) \cdot r^*(t+N+k)}{\sqrt{\sum_{k=0}^{N-1} |r(t+k)|^2} \sqrt{\sum_{k=0}^{N-1} |r(t+N+k)|^2}}$$

or $$\frac{\sum_{k=0}^{N-1} r(t-k) \cdot r^*(t-N-k)}{\sqrt{\sum_{k=0}^{N-1} |r(t-k)|^2} \sqrt{\sum_{k=0}^{N-1} |r(t-N-k)|^2}}$$

The denominator includes all the sample data used by the numerator, i.e. all the corresponding energy of the sample data is considered. The above equation can be modified to become $$\frac{\sum_{k=0}^{N-1} r(t+k) \cdot r^*(t+N+k)}{\sum_{k=-N}^{N-1} |r(t+N+k)|^2}$$

or $$\frac{\sum_{k=0}^{N-1} r(t-k) \cdot r^*(t-N-k)}{\sum_{k=-N}^{N-1} |r(t-N-k)|^2}$$

The denominator also reflects all the corresponding energy of the sample data used by the numerator.

Figure 1:
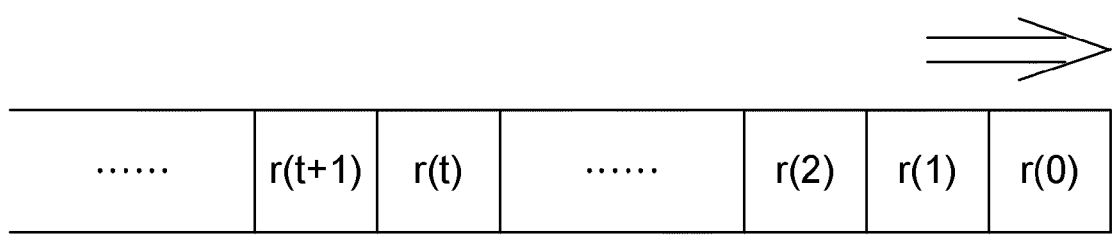
FIG. 1 is a diagram of the receiving signal after sampled.
Figure 2:
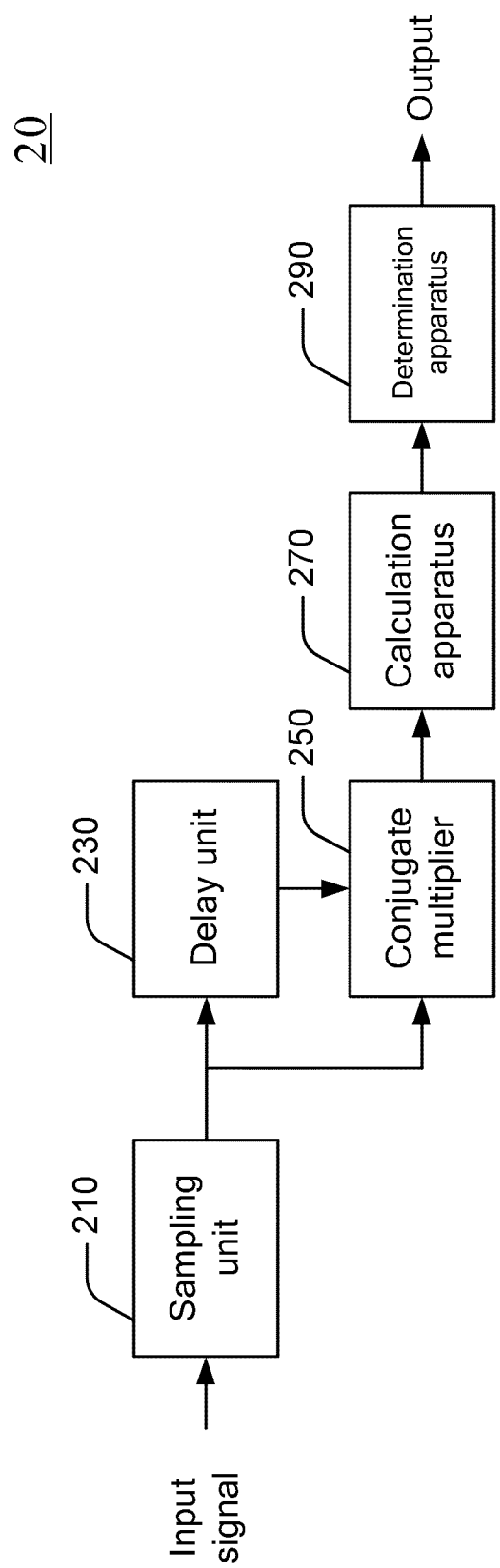
FIG. 2 is a block diagram of a packet detection apparatus 20 according to one embodiment of the present invention.

FIG. 2 is a block diagram of a packet detection apparatus 20 according to one embodiment of the present invention. The apparatus 20, for determining whether an input signal is a target signal matching the system specification, comprises a sampling unit 210, a delay unit 230, a conjugate multiplier 250, a calculation apparatus 270 and a determination apparatus 290.

The sampling unit 210 receives the input signal. From time $t-2N+1$ to time $t$, the input signal is sampled to output 2N sample values $r(t-2N+1)$, $r(t-2N+2)$, $r(t-1)$ and $r(t)$. The 2N sample values have a period N, where N is a positive integer.

The delay unit 230 delays N sample values within 2N sample values, $r(t-2N+1)$, $r(t-2N+2)$, $r(t-N-1)$ and $r(t-N)$, for one period of the input signal to output N delayed sample values $r'(t-N+1)$, $r'(t-N+2)$, ..., $r'(t-1)$ and $r'(t)$. It is noted that the delayed sample values $r'(t-N+1)$, $r'(t-N+2)$, ..., $r'(t-1)$ and $r'(t)$ are equal to the sample values $r(t-2N+1)$, $r(t-2N+2)$, ..., $r(t-N-1)$ and $r(t-N)$. The delay unit 230 can be realized by a buffer or a memory.

The conjugate multiplier 250 receives the N delayed sample values $r'(t-N+1)$, $r'(t-N+2)$, ... $r'(t-1)$ and $r'(t)$ and the N undelayed sample values within the 2N sample values $r(t-N+1)$, $r(t-N+2)$, ..., $r(t-1)$ and $r(t)$. Similarly, the delayed sample values is the delay of the sample values, so they can be viewed as 2N sample values, and one can use delay correlation to calculate the N delayed sample values and the N undelayed sample values to process conjugately multiplying to obtain a plurality of conjugate multiplying values.

The calculation apparatus 270 calculates the conjugate multiplying values to obtain a determination value. The determination apparatus 290 compares the determination value with a threshold. When the determination value is larger than the threshold, the input signal is determined to be the target signal matching the system specification; otherwise, it is determined to be not the target signal. And, the threshold and the determination value both can be between 0 and 1. The sample values and the delayed sample values are complex.

Figure 3:
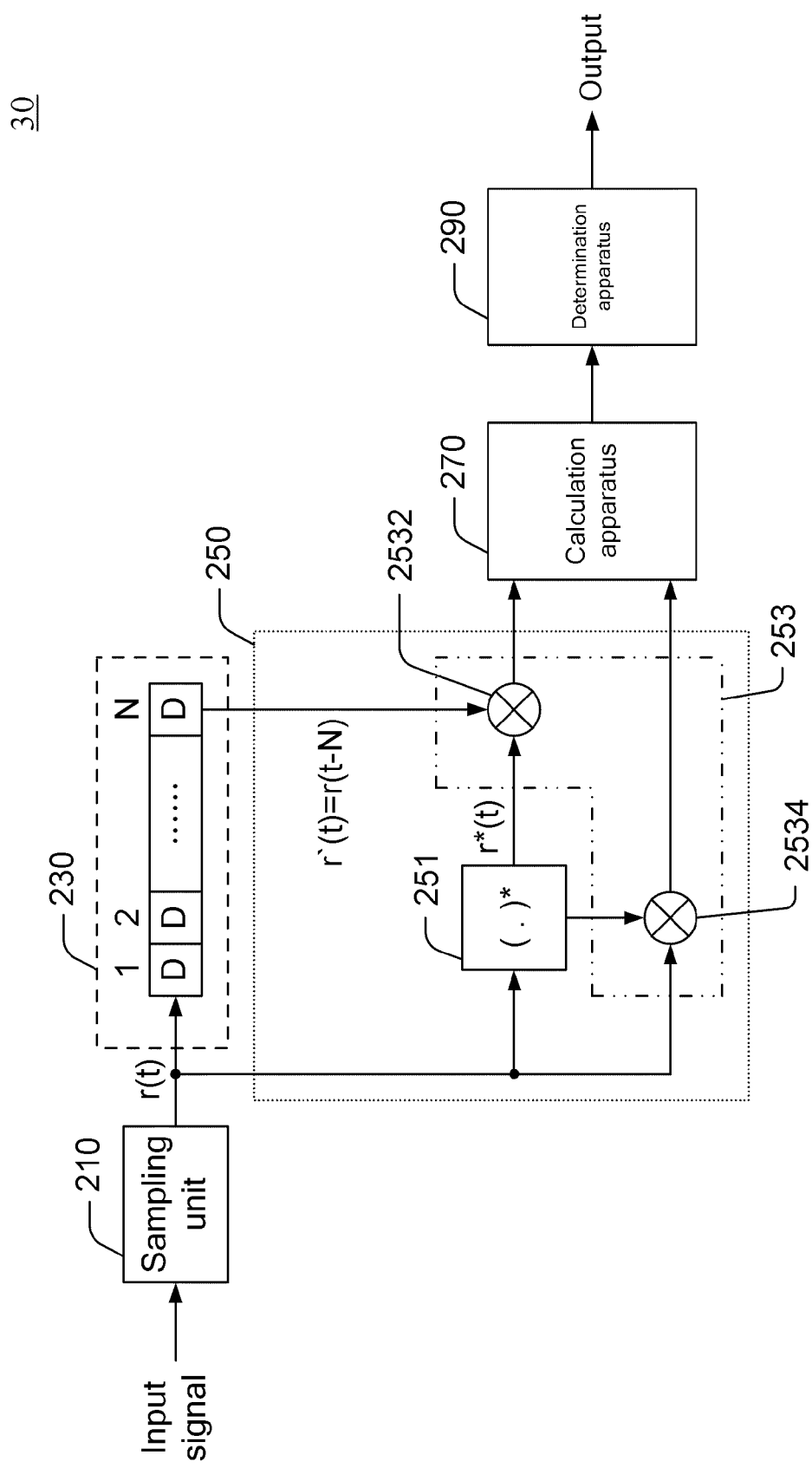
FIG. 3 is a block diagram of a packet detection apparatus according to one embodiment of the present invention.

FIG. 3 is a block diagram of a packet detection apparatus 30 according to one embodiment of the present invention. The apparatus 30 comprises the sampling unit 210, the delay unit 230, the conjugate multiplier 250, the calculation apparatus 270, and the determination apparatus 290. The sampling unit 210 and the delay unit 230 are similar to the above, so it is not repeated here. The conjugate multiplier 250 comprises a conjugate convertor 251 and a multiplier 253. The multiplier 253 comprises multiplying units 2532 and 2534.

The conjugate convertor 251 receives 2N sample values $r(t-2N+1)$, $r(t-2N+2)$, ..., $r(t-1)$ and $r(t)$ and conjugates them to output corresponding 2N conjugate values $r^*(t-2N+1)$, $r^*(t-2N+2)$, ..., $r^*(t-1)$ and $r^*(t)$. The multiplying unit 2532 multiplies the N conjugate values $r^*(t-N+1)$, $r^*(t-N+2)$, ..., $r^*(t-1)$ and $r^*(t)$ by the N delayed sample values $r(t-2N+1)$, $r(t-2N+2)$, ..., $r(t-N-1)$ and $r(t-N)$ one-to-one to obtain N conjugate multiplying values $r^*(t-N-1) \cdot r(t-N-k)$, $k=0, 1, \ldots, N-1$. The multiplying unit 2534 multiplies the 2N sample values $r(t-2N+1)$, $r(t-2N+2)$, ..., $r(t-1)$ and $r(t)$ by the 2N sample values $r^*(t-2N+1)$, $r^*(t-2N+2)$, ..., $r^*(t-1)$ and $r^*(t)$ one-to-one to obtain 2N conjugate multiplying values $r(t-k) \cdot r^*(t-k)$, $k=0, 1, \ldots, 2N-1$.

The calculation apparatus 270 sums up the N conjugate multiplying values $r^*(t-k) \cdot r(t-N-k)$, $k=0, 1, \ldots, N-1$ to obtain the numerator $$\sum_{k=0}^{N-1} r^*(t-k) \cdot r(t-N-k).$$

And, the sample values needed for calculating the numerator are from $r(t-2N+1)$ to $r(t)$, i.e. there are also 2N sample values needed for calculating the denominator, which means the reference information are consistent with calculating the numerator.

In another preferable embodiment, the calculation apparatus 270 sums up N conjugate multiplying values respectively to get $$\sum_{k=0}^{N-1} r(t-k) \cdot r^*(t-k) \text{ and } \sum_{k=0}^{N-1} r(t-N-k) \cdot r^*(t-N-k),$$

square roots those two numbers respectively and then multiplies them, or multiplies them first and then square roots them to obtain another denominator $$\frac{\sqrt{\sum_{k=0}^{N-1} r(t-k) \cdot r^*(t-k)} \sqrt{\sum_{k=0}^{N-1} r(t-N-k) \cdot r^*(t-N-k)}}{\sqrt{\left(\sum_{k=0}^{N-1} r(t-k) \cdot r^*(t-k)\right) \cdot \left(\sum_{k=0}^{N-1} r(t-N-k) \cdot r^*(t-N-k)\right)}}.$$

The determination apparatus 290 divides the numerator by the denominator to obtain the determination as follows:

$$\frac{\sum_{k=0}^{N-1} r^*(t-k) \cdot r(t-N-k)}{\sum_{k=0}^{N-1} r(t-k) \cdot r^*(t-k)}$$

or $\frac{\sum_{k=0}^{N-1} r^*(t-k) \cdot r(t-N-k)}{\sqrt{\sum_{k=0}^{N-1} |r(t-k)|^2} \sqrt{\sum_{k=0}^{N-1} |r(t-N-k)|^2}}$ The determination apparatus 290 compares the determination value with a threshold. When the determination value is larger than the threshold, the input signal is determined to be the target signal matching the system specification; otherwise, it is determined to be not the target signal. And, the threshold and the determination value both can be between 0 and 1. The sample values and the delayed sample values are complex.

Figure 4:
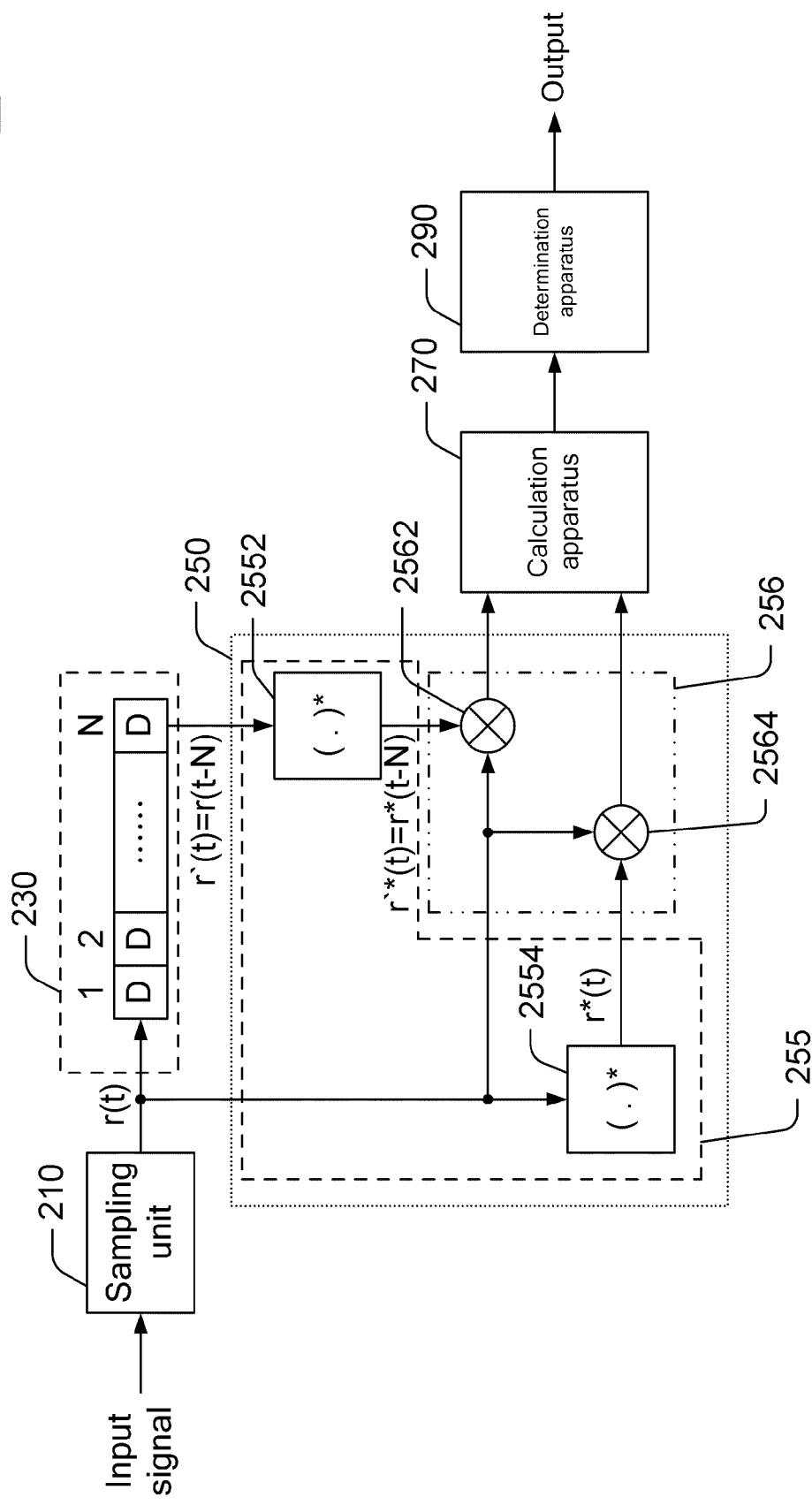
FIG. 4 is a block diagram of a packet detection apparatus 40 according to another embodiment of the present invention.

FIG. 4 is a block diagram of a packet detection apparatus 40 according to another embodiment of the present invention. The apparatus 40 comprises the sampling unit 210, the delay unit 230, the conjugate multiplier 250, the calculation apparatus 270 and the determination apparatus 290. The following makes more detailed description on the conjugate multiplier 250; and the sampling unit 210, the delay unit 230, the calculation apparatus 270 and the determination apparatus 290 are similar to the above, so it is not repeated here. The conjugate multiplier 250 comprises a conjugate convertor 255 and a multiplier 256. The conjugate convertor comprises conjugate converting units 2552 and 2554. The multiplier 256 comprises multiplying units 2562 and 2564.

The conjugate converting unit 2552 receives N delayed sample values r(t−2N+1), r(t−2N+2), . . . , r(t−N−1) and r(t−N) and conjugates them for outputting N conjugate delayed values r*(t−2N+1), r*(t−2N+2), . . . , r*(t−N−1) and r*(t−N). The conjugate converting unit 2554 receives 2N sample values and conjugates them for outputting 2N conjugate values r*(t−2N+1), r*(t−2N+2), . . . , r*(t−1) and r*(t).

The multiplying unit 2562 multiplies N sample values r(t−N+1), r(t−N+2), . . . , r(t−1) and r(t) by N conjugate delayed values r*(t−2N+1), r*(t−2N+2), . . . , r*(t−N−1) and r*(t−N) one-to-one for obtaining N conjugate multiplying values r(t−k)·r*(t−N−k), k=0, 1, . . . , N−1. The multiplying unit 2564 multiplies 2N sample values r(t−2N+1), r(t−2N+2), . . . , r(t−1) and r(t) by 2N conjugate values r*(t−2N+1), r*(t−2N+2), . . . , r*(t−1) and r*(t) one-to-one for obtaining 2N conjugate multiplying values r(t−k)·r*(t−k), k=0, 1, . . . , 2N−1.

Figure 5:
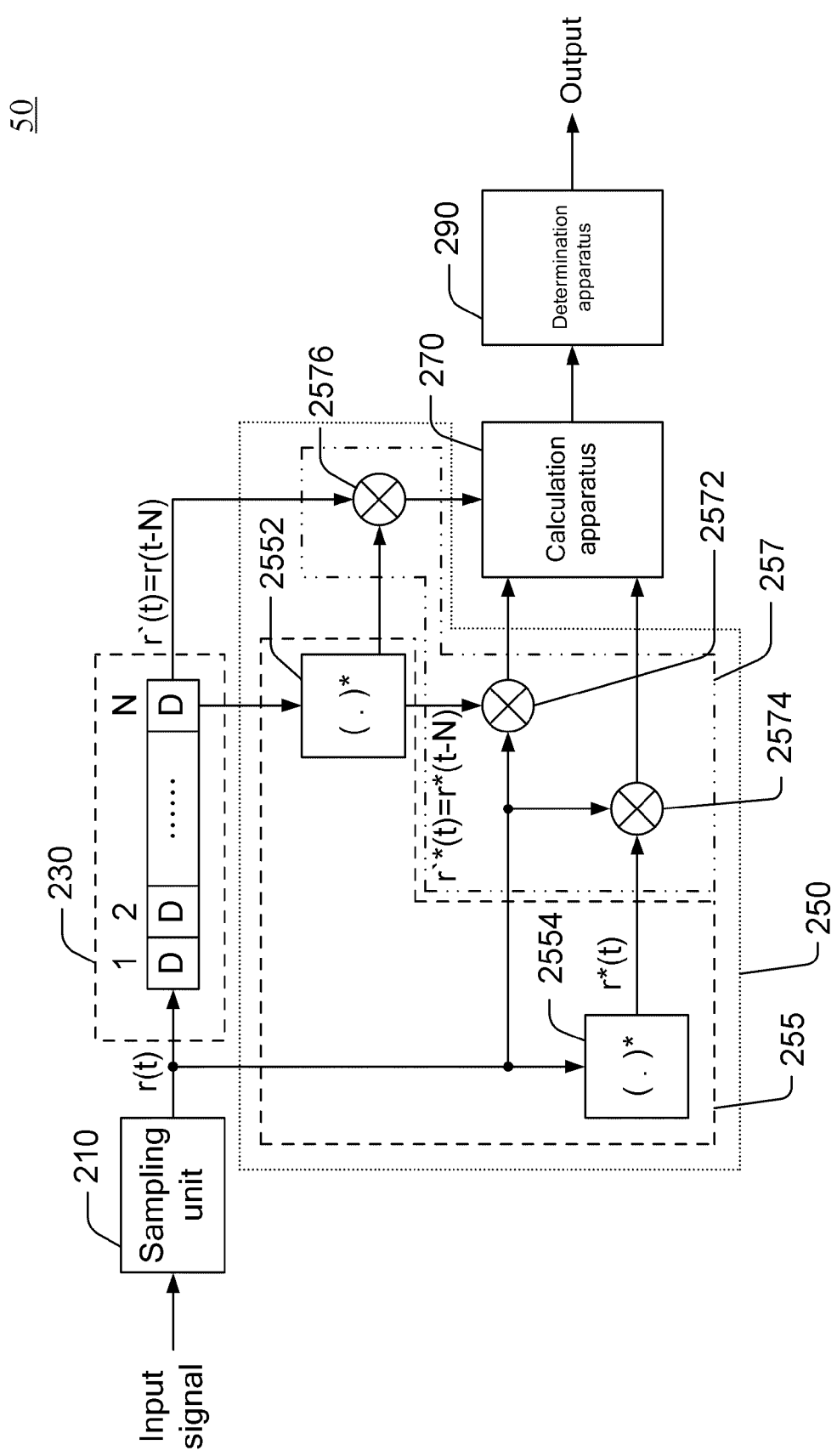
FIG. 5 is a block diagram of a packet detection apparatus 50 according to another embodiment of the present invention.

FIG. 5 is a block diagram of a packet detection apparatus 50 according to another embodiment of the present invention. The apparatus 50 comprises the sampling unit 210, the delaying unit 230, the conjugate multiplier 250, the calculation apparatus 270, and the determination apparatus 290. The conjugate multiplier 250 comprises the conjugate convertor 255 and a multiplier 257. The conjugate convertor 255 comprises conjugate converting units 2552 and 2554. The multiplier 257 comprises multiplying units 2572, 2574, and 2576. The sampling unit 210, the delay unit 230, the conjugate convertor 255, the calculation apparatus 270, and the determination apparatus 290 are similar to the above; and the multiplying units 2572 and 2574 are similar to the above multiplying units 2562 and 2564 respectively, so it is not repeated here.

The multiplying unit 2576 multiplies N delayed sample values r(t−2N+1), r(t−2N+2), r(t−N−1) and r(t-N) by N conjugate delayed values r*(t−2N+1), r*(t−2N+2), . . . , r*(t−N−1) and r*(t−N) one-to-one for obtaining N conjugate multiplying values r(t−N−k)·r*(t−N−k), k=0, 1, . . . , N−1. Calculating N conjugate multiplying values r(t−k)·r*(t−k), k=0, 1, . . . , N−1 by the multiplying unit 2574 can also obtain 2N conjugate multiplying values r(t−k)·r*(t−k), k=0, 1, . . . , 2N−1.

Figure 6:
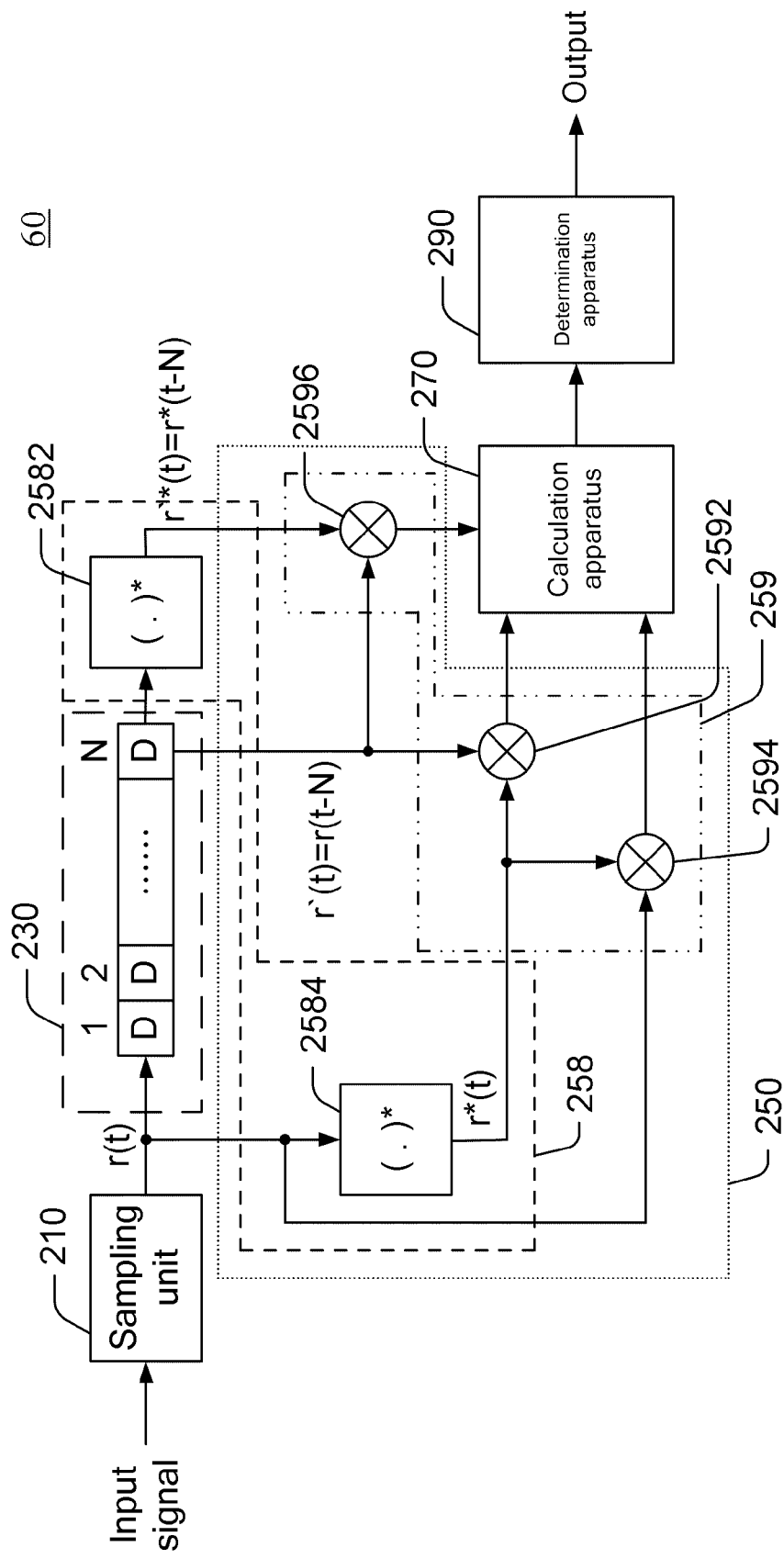
FIG. 6 is a block diagram of a packet detection apparatus 60 according to another embodiment of the present invention.

FIG. 6 is a block diagram of a packet detection apparatus 60 according to another embodiment of the present invention. The apparatus 60 comprises the sampling unit 210, the delaying unit 230, the conjugate multiplier 250, the calculation apparatus 270 and the determination apparatus 290. The conjugate multiplier 250 comprises a conjugate convertor 258 and a multiplier 259. The conjugate convertor 258 comprises conjugate converting units 2582 and 2584. The multiplier 259 comprises multiplying units 2592, 2594, and 2596. The sampling unit 210, the delay unit 230, the calculation apparatus 270, and the determination apparatus 290 are similar to the above; the conjugate converting units 2582 and 2584 are similar to the conjugate converting units 2552 and 2554 respectively, and the multiplying units 2592, 2594, and 2596 are similar to the above multiplying units 2532, 2574, and 2576 respectively, so it is not repeated here.

Figure 7:
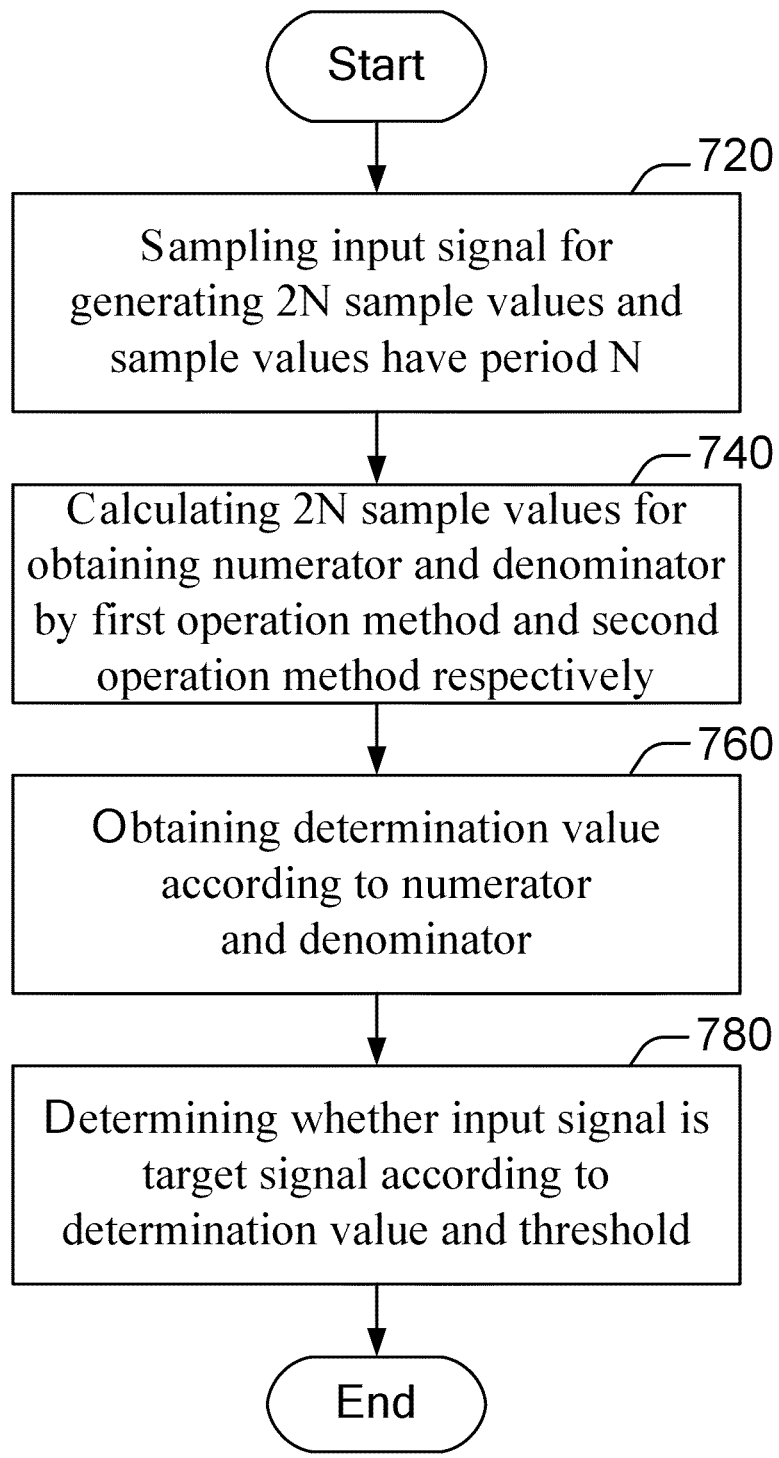
FIG. 7 is a flowchart of packet detection according to one embodiment of the present invention.

FIG. 7 is a flowchart of packet detection according to one embodiment of the present invention. Step 720 is sampling an input signal for generating 2N sample values r(t−2N+1), r(t−2N+2), . . . , r(t−1) and r(t), t=0, 1, 2, . . . , and the sample values have a period N, where N is a positive integer. Step 740 is calculating the 2N sample values for obtaining the numerator and the denominator by a first operation method and a second operation method respectively. For example, the numerator is $$\sum_{k=0}^{N-1} r(t-k) \cdot r^*(t-N-k) \text{ or } \sum_{k=0}^{N-1} r^*(t-k) \cdot r(t-N-k),$$

and the denominator is $$\sum_{k=0}^{2N-1} r(t-k) \cdot r^*(t-k) \text{ or }$$

$$\sqrt{\sum_{k=0}^{N-1} r(t-k) \cdot r^*(t-k)} \sqrt{\sum_{k=0}^{N-1} r(t-N-k) \cdot r^*(t-N-k)}.$$

Step 760 is obtaining a determination value according to the numerator and the denominator. Step 780 is determining whether the input signal is the target signal according to the determination value and a threshold. When the determination value is larger than the threshold, the input signal is determined to be the target signal matching the system specification; otherwise, it is determined to be not the target signal. And, the threshold and the determination value both can be between 0 and 1. The sample values are complex.

Figure 8A:
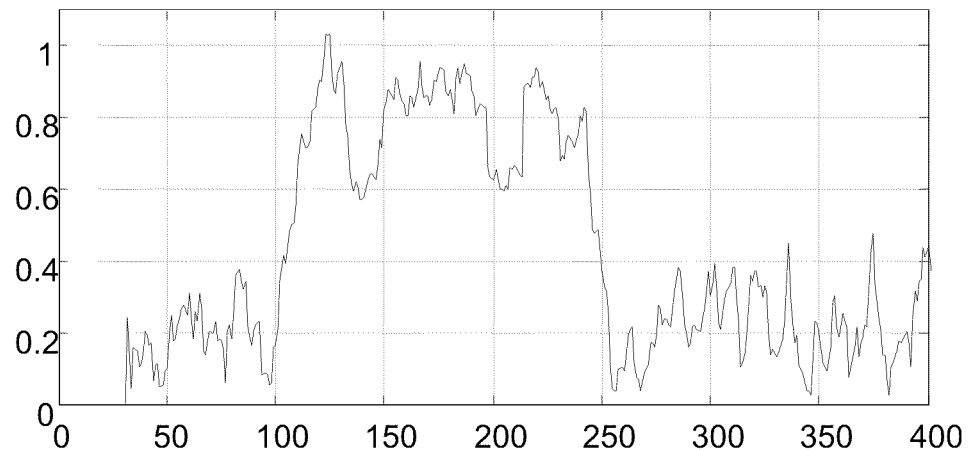
FIG. 8A is a peak interval diagram of a delay correlation for a measured signal according to the prior.
Figure 8B:
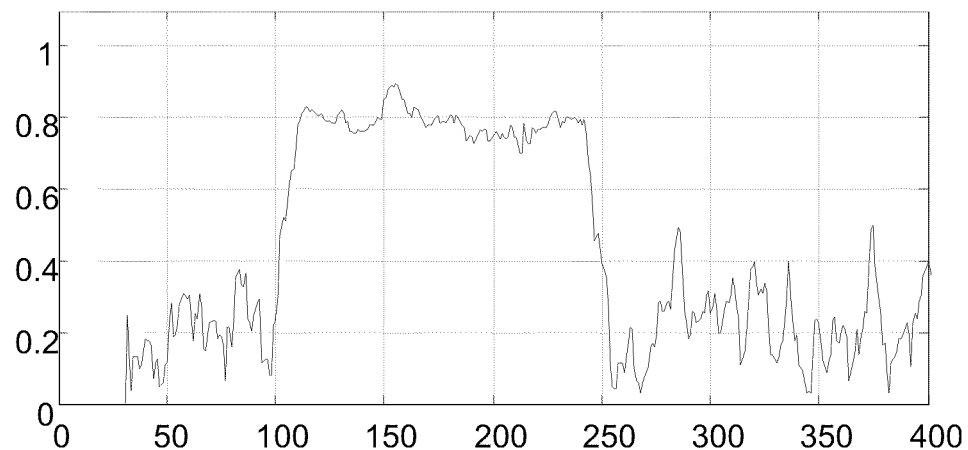
FIG. 8B is a peak interval diagram of a delay correlation for a measured signal according to one embodiment of the present invention.

FIG. 8A is a peak interval diagram of a delay correlation for a measured signal according to the prior. FIG. 8B is a peak interval diagram of a delay correlation for a measured signal according to one embodiment of the present invention. Since the sample values for calculating the denominator are the same as those for calculating the numerator according to the invention, the denominator refers all the energy of the sample values for calculating the numerator. Since the number of sample values for calculating the numerator and the denominator of the determination value are the same, i.e. the energy involved is consistent, the peak interval of the determination value is calculated smoother and more stable (comparing the peak interval between FIG. 8A and FIG. 8B), which reduces the opportunity for determining error. Hence, the invention discloses a target signal determination method and associated apparatus using delay correlation for determining the target signal more correctly.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method using delay correlation for determining whether an input signal is a target signal implemented in a signal receiving electronic device with a non-transitory computer-readable storage medium storing an executable program, comprising:

receiving the input signal by the signal receiving electronic device;

sampling the input signal to generate 2N sample values, wherein the period of the sample values is N, where N is a positive integer;

obtaining a first value according to a first operation method by processing the 2N sample values by the signal receiving electronic device instructed by the executable program stored in the non-transitory computer-readable storage medium;

obtaining a second value according to a second operation method by processing the 2N sample values by the signal receiving electronic device instructed by the executable program stored in the non-transitory computer-readable storage medium;

obtaining a determination value according to a ratio of the first value and the second value, wherein the determination value is a quotient of the first value divided by the second value, and the second value equals $\Sigma_{k=-N}^{N-1} |r(t-N-k)|^2$ where r(t) is a sample value at time t; and determining whether the input signal is the target signal or not according to the determination value and a threshold; and continuing to receive said input signal if said input signal is determined to be said target signal, otherwise, discontinuing receipt of said input signal.

2. The method according to claim 1, wherein the first operation method comprises:

conjugating a first plurality of N sample values for obtaining N conjugate values;

multiplying the N conjugate values by a second plurality of N sample values one-to-one; and summing up for obtaining the first value.

3. The method according to claim 2, wherein the second operation method comprises:

multiplying the 2N sample values by their conjugations; and summing up for obtaining the second value.

4. The method according to claim 3, wherein the second operation method further comprises:

multiplying the first plurality of N sample values by their conjugations;

summing up and square rooting for obtaining a first square root;

multiplying the second plurality of N sample values by their conjugations;

summing up and square rooting for obtaining a second square root; and multiplying the first square root with the second square root for obtaining the second value.

5. The method according to claim 1, wherein the step of determining further comprises:

determining the input signal as the target signal when the determination value is larger than or equal to the threshold; and determining the input signal not the target signal when the determination value is larger than or equal to the threshold.

6. The method according to claim 1, wherein the sample values are complex.

7. The method according to claim 1, wherein the determination value is between zero (0) and one (1).

8. The method according to claim 7, wherein the threshold is between zero (0) and one (1).

9. A communication apparatus for receiving an input signal and using delay correlation for determining whether the input signal is a target signal, comprising:

a receiver, for receiving the input signal;

a sampling circuit, for sampling the input signal to generate 2N sample values, wherein the period of the 2N sample values is N, where N is a positive integer;

a delaying circuit, for delaying a first plurality of N sample values to output N delayed sample values, wherein the first plurality of N sample values is within the 2N sample values;

a conjugate multiplier, for conjugately multiplying the N delayed sample values with the first plurality of N sample values to generate a plurality of conjugate multiplying values;

a calculation apparatus, coupled to the conjugate multiplier, for calculating the conjugate multiplying values to obtain a determination value; and a determination apparatus, coupled to the calculation apparatus, for determining whether the input signal is the target signal or not according to the determination value and a threshold;

wherein the determination value is the quotient of a first value divided by a second value, and the second value equals $\Sigma_{k=-N}^{N-1} |r(t-N-k)|^2$ where r(t) is a sample value at time t;

wherein the first value is obtained from the 2N sample values according to a first operation method, and the second value is obtained from the same 2N sample values according to a second operation method wherein said communication apparatus continues to receive said input signal if said determination apparatus determines said input signal is said target signal, and said communication apparatus discontinues receiving said input signal if said determination apparatus determines said input signal is not said target signal.

10. The apparatus according to claim 9, wherein the conjugate multiplier generates a first plurality of conjugate multiplying values by multiplying the N delayed sample values by one-to-one conjugations with the first plurality of N sample values; and the calculation apparatus calculates the first plurality of conjugate multiplying values to obtain the first value.

11. The apparatus according to claim 10, wherein the conjugate multiplier further generates a second plurality of conjugate multiplying values by multiplying the 2N sample values by their conjugations one-to-one, and the calculation apparatus calculates the second plurality of conjugate multiplying values to obtain the second value.

12. The apparatus according to claim 10, wherein
the conjugate multiplier multiplies the first plurality of N sample values by their conjugations one-to-one to obtain a first set of N conjugate multiplying values, and multiplies a second plurality of N sample values within the 2N sample values by their conjugations one-to-one to obtain a second set of N conjugate multiplying values, and
the calculation apparatus sums up the first set of N conjugate multiplying values and calculates their square roots to obtain a first square root value, sums up the second set of N conjugate multiplying values and calculates their square roots to obtain a second square root value, and multiplies the first square root value by the second square root value to obtain the second value, or the calculation sums up the first set of N conjugate multiplying values, sums up the second set of N conjugate multiplying values, and square roots the product of them to obtain the second value.

13. The apparatus according to claim 9, wherein the conjugate multiplier comprises
a conjugate convertor, for conjugating the 2N sample values to output corresponding 2N conjugate values; and
a multiplier, for receiving the 2N sample values, the 2N conjugate values and the N delayed sample values, multiplying the N conjugate values within the 2N conjugate values by the N delayed sample values one-to-one to output a first set of conjugate multiplying values, and multiplying the 2N sample values by the 2N conjugate values one-to-one to output a second set of conjugate multiplying values;
wherein the calculation apparatus calculates the first set of conjugate multiplying values and the second set of conjugate multiplying values to obtain the determination value.

14. The apparatus according to claim 9, wherein the conjugate multiplier comprises
a conjugate convertor, for conjugating the 2N sample values and the N delayed sample values respectively to output corresponding 2N conjugate values and N conjugate delayed values; and
a multiplier, for receiving the 2N sample values, the 2N conjugate values and the N conjugate delayed values, multiplying the first plurality of N sample values by the N conjugate delayed values one-to-one to output a first set of conjugate multiplying values, and multiplying the 2N sample values by the 2N conjugate values one-to-one to output a second set of conjugate multiplying values;
wherein the calculation apparatus calculates the first set of conjugate multiplying values and the second set of conjugate multiplying values to obtain the determination value.

15. The apparatus according to claim 9, wherein the conjugate multiplier comprises
a conjugate convertor, for conjugating the 2N sample values and the N delayed sample values respectively to output corresponding 2N conjugate values and N conjugate delayed values; and
a multiplier, for receiving the first plurality of N sample values, a first plurality of N conjugate values, the N delayed sample values, and the N conjugate delayed values, for multiplying the first plurality of N conjugate delayed values by the N sample values one-to-one to output a first set of conjugate multiplying values, for multiplying the N sample values by the first plurality of N conjugate values one-to-one to output a second set of conjugate multiplying values, and for multiplying the N delayed sample values by the N conjugate delayed values one-to-one to output a third set of conjugate multiplying values, wherein the first plurality of N conjugate values is within the 2N conjugate values;
wherein the calculation apparatus calculates the first set of conjugate multiplying values, the second set of conjugate multiplying values, and the third set of conjugate multiplying values to obtain the determination value.

16. The apparatus according to claim 9 wherein the conjugate multiplier comprises
a conjugate convertor, for conjugating the 2N sample values and the N delayed sample values respectively to output corresponding 2N conjugate values and N conjugate delayed values; and
a multiplier, for receiving the first plurality of N sample values, a first plurality of N conjugate values, the N delayed sample values, and the N conjugate delayed values, for multiplying the N delayed sample values by the first plurality of N conjugate values one-to-one to output a first set of conjugate multiplying values, for multiplying the N sample values by the first plurality of N conjugate values one-to-one to output a second set of conjugate multiplying values, and for multiplying the N delayed sample values by the N conjugate delayed values one-to-one to output a third set of conjugate multiplying values, wherein the first plurality of N conjugate values is within the 2N conjugate values;
wherein the calculation apparatus calculates the first set of conjugate multiplying values, the second set of conjugate multiplying values, and the third set of conjugate multiplying values to obtain the determination value.

17. The apparatus according to claim 9, wherein the determination value is between zero (0) and one (1).

18. The apparatus according to claim 17, wherein the threshold is between zero (0) and one (1).

19. The apparatus according to claim 9, wherein the sample values are complex.

* * * * *